(12) United States Patent
Chin et al.

(10) Patent No.: US 9,082,787 B2
(45) Date of Patent: Jul. 14, 2015

(54) SEMICONDUCTOR STRUCTURE AND MANUFACTURING PROCESS THEREOF

(71) Applicant: Macronix International Co., Ltd., Hsinchu (TW)

(72) Inventors: Yu-Hsien Chin, Taipei (TW); Chih-Chia Hsu, Zhongli (TW); Yin-Fu Huang, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/138,213

(22) Filed: Dec. 23, 2013

(65) Prior Publication Data

US 2014/0106519 A1    Apr. 17, 2014

Related U.S. Application Data

(62) Division of application No. 13/411,890, filed on Mar. 5, 2012, now Pat. No. 8,659,080.

(51) Int. Cl.

| H01L 31/072 | (2012.01) |
| H01L 31/109 | (2006.01) |
| H01L 29/66 | (2006.01) |
| H01L 29/40 | (2006.01) |
| H01L 29/423 | (2006.01) |
| H01L 29/78 | (2006.01) |
| H01L 29/08 | (2006.01) |
| H01L 29/10 | (2006.01) |

(52) U.S. Cl.
CPC ........ *H01L 29/66477* (2013.01); *H01L 29/401* (2013.01); *H01L 29/42368* (2013.01); *H01L 29/66681* (2013.01); *H01L 29/7816* (2013.01); *H01L 29/0878* (2013.01); *H01L 29/1087* (2013.01)

(58) Field of Classification Search
CPC .................................. H01L 29/66477
USPC ................. 438/197, 289; 257/288, 335–336
See application file for complete search history.

(56) References Cited

U.S. PATENT DOCUMENTS

| 5,215,934 A * | 6/1993 | Tzeng ........................ 438/264 |
| 6,468,870 B1 | 10/2002 | Kao et al. |
| 6,608,336 B2 | 8/2003 | Kikuchi et al. |
| 2003/0153154 A1* | 8/2003 | Uehara et al. ............... 438/299 |
| 2007/0063271 A1* | 3/2007 | Takimoto et al. ............ 257/330 |

OTHER PUBLICATIONS

SIPO Office Action dated May 6, 2015 in corresponding Chinese application (No. 201210043382.7).

* cited by examiner

*Primary Examiner* — Theresa T Doan
(74) *Attorney, Agent, or Firm* — McClure, Qualey & Rodack, LLP

(57) ABSTRACT

A semiconductor structure includes a substrate having a first conductive type, a well having a second conductive type formed in the substrate, a first doped region and a second doped region formed in the well, a field oxide, a first dielectric layer and a second dielectric layer. The field oxide is formed on a surface region of the well and between the first doped region and the second doped region. The first dielectric layer is formed on the surface region of the well and covers an edge portion of the field oxide. The first dielectric layer has a first thickness. The second dielectric layer is formed on the surface region of the well. The second dielectric layer has a second thickness smaller than the first thickness.

9 Claims, 2 Drawing Sheets

SEMICONDUCTOR STRUCTURE AND MANUFACTURING PROCESS THEREOF

This application is a divisional application of U.S. application Ser. No. 13/411,890, filed Mar. 5, 2012, now U.S. Pat. No. 8,659,080, which is allowed for issuance as a patent.

BACKGROUND OF THE INVENTION

1. Field of the Invention

The invention relates in general to a semiconductor structure and a manufacturing process thereof, and more particularly to a metal oxide semiconductor (MOS) structure and a manufacturing process thereof.

2. Description of the Related Art

In the high voltage system, it is important for a metal oxide semiconductor (MOS) device having a high off-state breakdown voltage (Vbd) and a low on-state resistance (Ronsp), so that the MOS device can be operated under high voltage to allow a high current flowing between the drain and the source. Thus, the power consumption of the MOS device will be lowered. However, high off-state breakdown voltage and high on-state resistance generally come together, when the off-state breakdown voltage increases, the on-state resistance comparatively increases. Therefore, it does not tend to design a MOS device having an off-state breakdown voltage toward to maximum. It is an urgent problem to be resolved for industries to design MOS device having a high off-state breakdown voltage and a low on-state resistance.

SUMMARY OF THE INVENTION

The invention is directed to a semiconductor structure and a manufacturing process thereof, in which the thickness and the length of the dielectric layer are modulated to reduce the hot carrier effect and enhance the breakdown voltage.

According to a first aspect of the present invention, a semiconductor structure is disclosed. A semiconductor structure includes a substrate having a first conductive type, a well having a second conductive type formed in the substrate, a first doped region and a second doped region formed in the well, a field oxide, a first dielectric layer and a second dielectric layer. The field oxide is formed on a surface region of the well and between the first doped region and the second doped region. The first dielectric layer is formed on the surface region of the well and covers an edge portion of the field oxide. The first dielectric layer has a first thickness. The second dielectric layer is formed on the surface region of the well. The second dielectric layer has a second thickness smaller than the first thickness.

According to a second aspect of the present invention, a manufacturing process of a semiconductor is disclosed. A substrate having a first conductive type is provided. A well having a second conductive type is formed in the substrate. A first doped region and a second doped region are formed in the well. A field oxide is formed on a surface region of the well and between the first doped region and the second doped region. A first dielectric layer is formed on the surface region of the well and covering an edge portion of the field oxide. The first dielectric layer has a first thickness. A second dielectric layer is formed on the surface region of the well. The second dielectric layer has a second thickness smaller than the first thickness.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the semiconductor structure and the manufacturing process of the invention, the thick dielectric layer covered the edge portion of the field oxide, and the density of the tip electric field near the edge portion of the field oxide is lowered to reduce the hot carrier effect. In addition, with the isolation provided by two dielectric layers having different thickness, the breakdown phenomenon occurred between the gate conductive layer and the body can be prevented.

A number of embodiments are disclosed below for detailed descriptions of the invention only, not for limiting the scope of protection of the invention.

Figure 1:
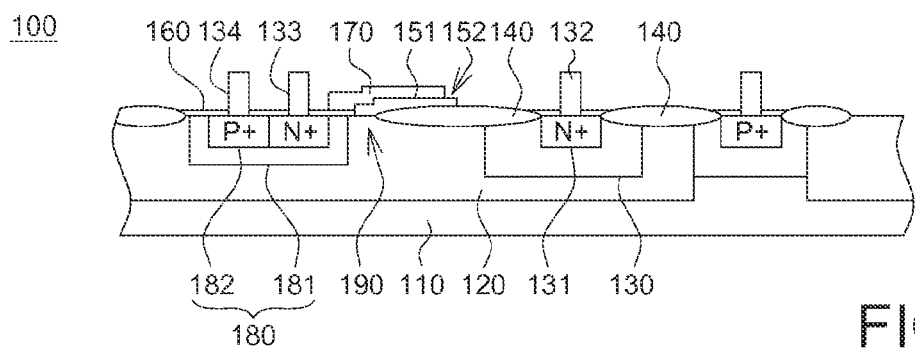
FIG. 1 is a schematic view illustrating a semiconductor structure according to an embodiment of the present invention.

FIG. 1 is a schematic view illustrating a semiconductor structure according to an embodiment of the present invention. The semiconductor structure 100, such as a double diffusion metal oxide semiconductor device, includes a substrate 110, a well 120, a first doped region 130, a second doped region 180, a field oxide 140, a first dielectric layer 151 and a second dielectric layer 160. The substrate 110, for example, is a p-type substrate, and the well 120, for example, is an n-type well formed in the substrate 110. The first doped region 130 and the second doped region 180 are disposed in the well 120. The first doped region 130 is such as an n-type doped region. The first doped region 130 has a heavy doped region 131, such as an N+ dopant region, which can be used as the contact region for the drain terminal 132. The second doped region 180 includes a body 181 and a heavy doped region 182. The body 181 is such as a p-type body, and the heavy doped region 182 is such as an N+ dopant region and a P+ dopant region, which can be used as the contact regions for the source terminal 133 and the bulk terminal 134. The field oxide 140 is formed on the surface region of the well 120, and between the first doped region 130 and the second doped region 180, the material is made from such as silicon oxide. The field oxide 140 can be a shallow trench isolating structure to isolate the first doped region 130 and the second doped region 180.

In the present embodiment, the first dielectric layer 151 and the second dielectric layer 160 are respectively formed on the surface region of the well 120, and the first dielectric layer 151 covers an edge portion 141 (such as bird beak portion) of the field oxide 140. The dielectric layer has a first thickness X1 ranged from 950-1000 angstrom (Å), such as 975 Å. In addition, the second dielectric layer 160 has a second thickness X2 ranged from 100-150 Å, such as 115 Å. In an embodiment, the first dielectric layer 151 can be used as thick gate oxide, and the second dielectric layer 160 can be used as thin gate oxide. As the thickness of the gate oxide decreases, the gate voltage of the semiconductor device decreases accordingly. For example, the first dielectric layer 151 can bear 40V gate voltage, and the second dielectric layer 160 can bear 5V gate voltage. Therefore, the threshold voltage of gate can be changed according to the thickness of the first dielectric layer 151 and the second dielectric layer 160. In the present embodiment, since the thin gate oxide (the second dielectric layer 160) is disposed on the p-type body 181, the threshold voltage of the gate does not increase.

Further, the first dielectric layer 151 and the second dielectric layer 160 are adjacent but not overlapped to each other. The first dielectric layer 151 covers a part of the channel region 190 and a part of the field oxide 140. The second dielectric layer 160 covers other part of the channel region 190 and a part of the second doped region 180. In addition, the gate conductive layer 170 is formed on the first dielectric layer 151 and the second dielectric layer 160, that is, above the body 181, the channel and a portion of field oxide 140. With the isolation provided by the first dielectric layer 151 and the second dielectric layer 160, the breakdown phenomenon occurred between the gate conductive layer 170 and the body 181 can be prevented. In the present embodiment, the voltage applied to the gate conductive layer 170 can be modulated to control the threshold voltage of the semiconductor structure 100 or to turn off the semiconductor structure 100. In addition, when a bias occurs between the voltage applied to the first doped region 130 and the voltage applied to the second doped region 180, the bias allows a current flowing between the first doped region 130 and the second doped region 180. For instance, under the operation of high voltage, the first doped region 130 is connected to a high voltage and the second doped region 180 is grounded.

In the embodiment, the thickness (first thickness X1) of the first dielectric layer 151 is greater than the thickness (the second thickness X2) of the second dielectric layer 160. Since the thick first dielectric layer 151 covers the edge portion 141 of the field oxide 140, the density of the tip electric field near the edge portion 141 of the field oxide 140 is lowered to reduce the hot carrier effect. In addition, since an end portion 152 of the first dielectric layer 151 is exposed from the gate conductive layer 170 and the area of the first dielectric layer 151 covered on the field oxide 140 is greater than that of the gate conductive layer 170, the breakdown voltage is enhanced.

Further, referring to FIGS. 2A-2F, a manufacturing process of a semiconductor according to an embodiment of the present invention is shown. In the FIG. 2A, a substrate 110 having a first conductive type is provided, and then a well 120 having a second conductive type is formed in the substrate 110. A doping process is conducted to form a first doped region 130 in the well 120. The first conductive type is such as p-type, and the second conductive type is such as n-type. The present invention is not limited thereto. In an embodiment, the first conductive type can be n-type, and the second conductive type can be p-type.

Figure 2A:
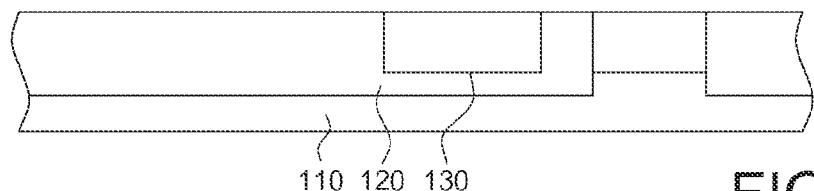
FIGS. 2A-2F are schematic views illustrating a manufacturing process of a semiconductor according to an embodiment of the present invention.
Figure 2B:
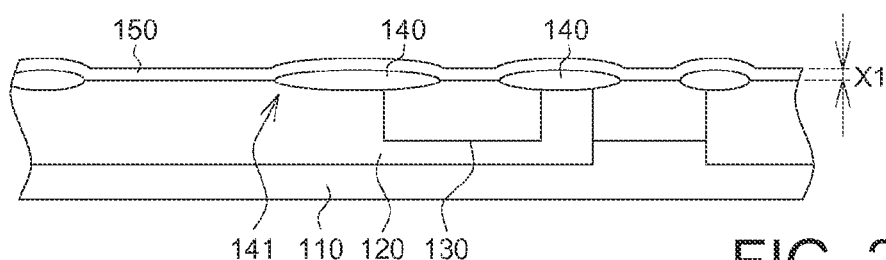

In the FIG. 2B, a local thermal oxidation process is conducted to form a field oxide 140 on the surface region of the well 120. The field oxide 140 is used to isolate the first doped region 130 from the second doped region 180. For example, the field oxide 140 and the first doped region 130 are connected, and a channel region 190 is formed between the field oxide 140 and the second doped region 180. Next, a dielectric material layer 150 is formed on the surface region of the well 120 by the thermal oxidation process and the dielectric material layer 150 covers the field oxide 140. The dielectric material layer 150 can be etched to form a first dielectric layer 151. The first dielectric layer 151 has a first thickness X1 ranged from 950-1000 Å, such as 975 Å. The first dielectric layer 151 is made from an insulating material such as silicon oxide, silicon nitride or silicon oxynitride etc. The oxidation condition of the first dielectric layer 151 can be modulated, such as the parameter of thermal oxidation for heating temperature or heating time etc, to precisely control the thickness of the growth. In addition, the first dielectric layer 151 can be formed by the sacrificial oxidation process. The present invention is not limited thereto.

Figure 2C:
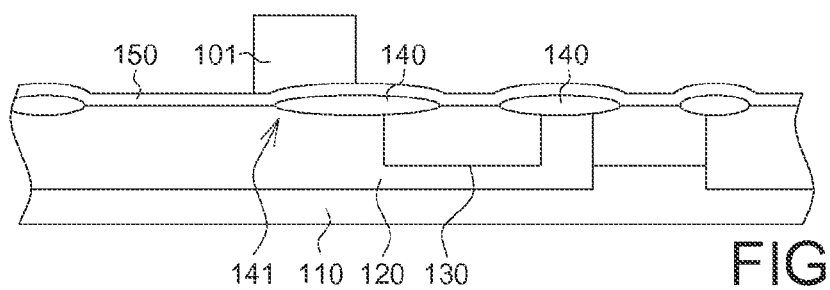
Figure 2D:
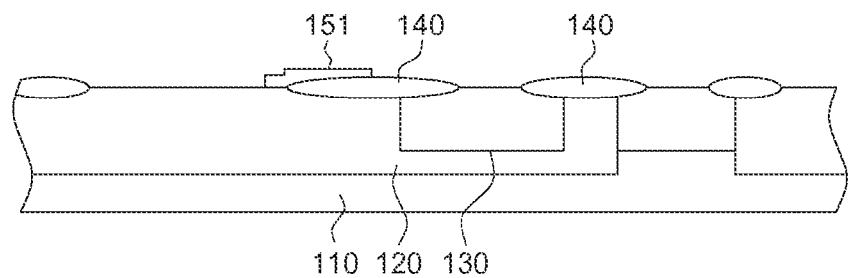

In the FIGS. 2C and 2D, a mask layer 101, such as a photoresist pattern, is formed on a portion of the dielectric material layer 150 to define the pattern of the first dielectric layer 151. Next, an exposed portion of the dielectric material layer 150, which is not covered by the mask layer 101, is removed by a wet etching or a dry etching process for example, so that the patterned first dielectric layer 151 can cover the edge portion 141 of the field oxide 140.

Figure 2E:
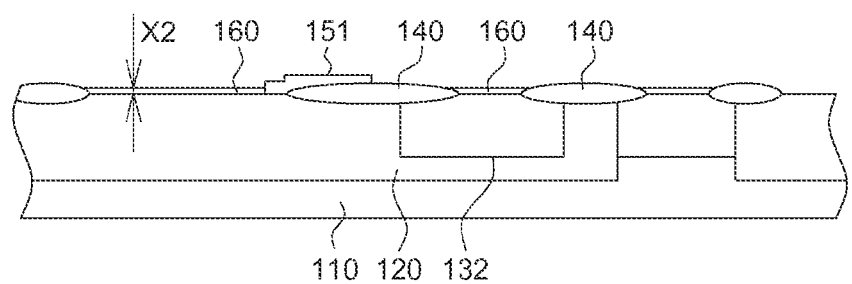

In the FIG. 2E, a second dielectric layer 160 is formed on the surface region of the well 120 by the thermal oxidation process. The second dielectric layer 160 has a second thickness X2 ranged from 100-150 Å, such as 115 Å. The second dielectric layer 160 is made from an insulating material such as silicon oxide, silicon nitride or silicon oxynitride etc. The oxidation condition of the second dielectric layer 160 can be modulated, such as the parameter of thermal oxidation for heating temperature or heating time etc, to precisely control the thickness of the growth. In addition, the second dielectric layer 160 can be formed by the sacrificial oxidation process. The present invention is not limited thereto.

Figure 2F:
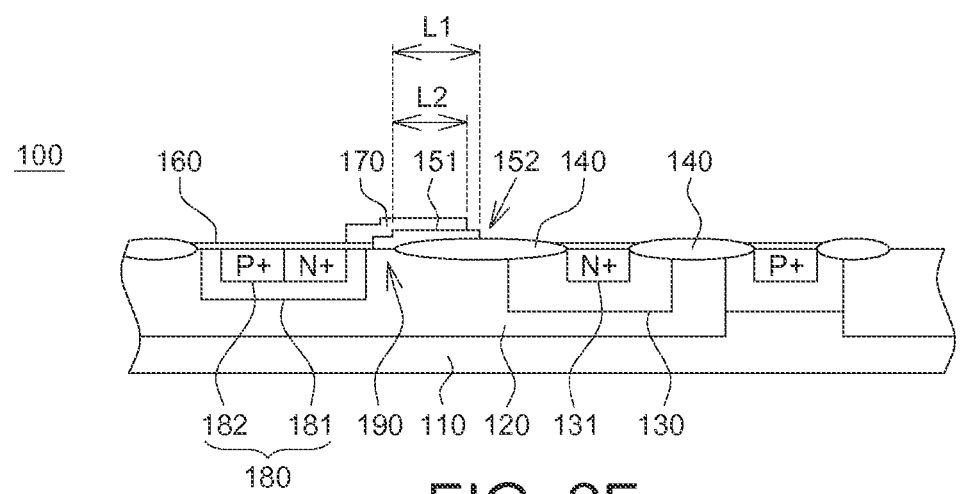

In the FIG. 2F, a gate conductive layer 170 is formed on the first dielectric layer 151 and the second dielectric layer 160 by a chemical vapor deposition method, for example. The gate conductive layer 170 is such as a doped poly silicon layer or a metal silicide. In the present embodiment, an end portion 152 of the first dielectric layer 151 is exposed from the gate conductive layer 170, and the area of the first conductive layer covered on the field oxide 140 is larger than the area of the gate conductive layer 170 covered on the field oxide 140. When a threshold voltage is applied to the gate conductive layer 170 to turns on the semiconductor device, and a bias is applied between the first doped region 130 and the second doped region 180, a current is generated between the first doped region 130 and the second doped region 180 and can flow through the gap in the channel region 190.

Since the thick first dielectric layer 151 covers the edge portion 141 of the field oxide 140, the density of the tip electric field near the edge portion 141 of the field oxide 140 is lowered to reduce the hot carrier effect. In addition, the gate conductive layer 170 is formed above the body 181, the channel region 190 and a portion of field oxide 140. With the isolation provided by the first dielectric layer 151 and the second dielectric layer 160, the breakdown phenomenon occurred between the gate conductive layer 170 and the body 181 can be prevented.

Moreover, referring to the following table, the comparison relationship between the length (L), the breakdown voltage of off-stat semiconductor (off-Vbd), the on-state resistance (Ronsp), the breakdown voltage of on-stat semiconductor (on-Vbd) and figure of merit (FOM) are listed. As shown in the FIG. 2F, L1 denotes the length of the first dielectric layer 151 covered on the field oxide 140, and L2 denotes the length of the gate conductive layer 170 covered on the field oxide 140. Referring to the data (L1>L2) compared with the data (L1<L2), when L1 is greater than L2, the breakdown voltage (off-Vbd) raises to 94V, and the breakdown voltage (on-Vbd) raises to 76V, so that FOM (Ronsp/off-Vbd) descends to 0.96. Therefore, the semiconductor device having high breakdown voltage and low on-state resistance is satisfied.

| Length (L) | Threshold voltage (Vt) | Breakdown voltage (off-Vbd) | On-state resistance (Ronsp) | Breakdown voltage (on-Vbd) | Figure of merit (FOM) |
| --- | --- | --- | --- | --- | --- |
| L1 < L2 | 1.557 | 85 | 90.28 | 68 | 1.062 |
| L1 > L2 | 1.576 | 94 | 90.33 | 76 | 0.96 |

The above-mentioned semiconductor structure 100 can be a metal oxidation semiconductor (MOS) device, such as a vertical diffusion MOS, a lateral double diffusion MOS (LD-MOS) or an enhanced diffusion MOS (EDMOS) device etc. However, the present invention is not limited thereto.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing process of a semiconductor, the process comprising:
   providing a substrate having a first conductive type;
   forming a well having a second conductive type in the substrate;
   forming a first doped region and a second doped region in the well;
   forming a field oxide on a surface region of the well and between the first doped region and the second doped region;
   forming a first dielectric layer on the surface region of the well and covering an edge portion of the field oxide, wherein the first dielectric layer has a first thickness;
   forming a second dielectric layer on the surface region of the well, wherein the second dielectric layer has a second thickness smaller than the first thickness; and
   forming a gate conductive layer on a portion of the field oxide covered by the first dielectric layer, wherein the size of an area of the field oxide covered by the first dielectric layer is greater than the size of an area of the field oxide covered by the gate conductive layer.

2. The process according to claim 1, wherein the first dielectric layer and the second dielectric layer are not overlapped.

3. The process according to claim 1, wherein the first dielectric layer is a first gate oxide layer, the second dielectric layer is a second gate oxide layer.

4. The process according to claim 1, wherein a channel region is formed between the field oxide and the second doped region, the first dielectric layer covers a part of the channel region and a part of the field oxide.

5. The process according to claim 1, wherein a channel region is formed between the field oxide and the second doped region, the first dielectric layer covers a part of the channel region and a part of the second doped region.

6. The process according to claim 1, wherein the first doped region is a drain doped region, the second doped region is a source doped region, the field oxide is connected to the first doped region, and a gap is formed between the field oxide and the second doped region.

7. The process according to claim 1, wherein the gate conductive layer is formed on the first dielectric layer and the second dielectric layer.

8. The process according to claim 7, wherein an end portion of the first dielectric layer is exposed from the gate conductive layer.

9. The process according to claim 1, wherein a portion of the first dielectric layer is covered by a mask layer and an etching process is conducted to define a pattern of the first dielectric layer.

\* \* \* \* \*